(12) United States Patent
Ching, Jr. et al.

(10) Patent No.: US 10,151,658 B2
(45) Date of Patent: Dec. 11, 2018

(54) PRESSURE-SENSING INTEGRATED CIRCUIT DEVICE WITH DIAPHRAGM

(71) Applicant: NXP USA, Inc., Austin, TX (US)

(72) Inventors: Mariano Layson Ching, Jr., Tianjin (CN); Allen M. Descartin, Tianjin (CN); Alexander M. Arayata, Austin, TX (US)

(73) Assignee: NXP USA, INC., Austin, TX (US)

( * ) Notice: Subject to any disclaimer, the term of this patent is extended or adjusted under 35 U.S.C. 154(b) by 157 days.

(21) Appl. No.: 15/356,622

(22) Filed: Nov. 20, 2016

(65) Prior Publication Data
US 2017/0292884 A1 Oct. 12, 2017

(30) Foreign Application Priority Data

Apr. 11, 2016 (CN) .......................... 2016 1 0218782

(51) Int. Cl.
| | | |
|---|---|---|
| *G01L 9/00* | (2006.01) | |
| *H01L 21/56* | (2006.01) | |
| *H01L 23/31* | (2006.01) | |
| *H01L 23/495* | (2006.01) | |
| *H01L 23/00* | (2006.01) | |
| *G01L 17/00* | (2006.01) | |

(52) U.S. Cl.
CPC .......... *G01L 9/0042* (2013.01); *H01L 21/565* (2013.01); *H01L 23/3107* (2013.01); *H01L 23/49503* (2013.01); *H01L 23/49541* (2013.01); *H01L 24/49* (2013.01); *H01L 24/85* (2013.01); *G01L 17/00* (2013.01); *H01L 2224/48091* (2013.01); *H01L 2224/48106* (2013.01); *H01L 2224/48247* (2013.01); *H01L 2924/14* (2013.01); *H01L 2924/146* (2013.01)

(58) Field of Classification Search
CPC ....... G01L 9/0042; G01L 17/00; H01L 24/49; H01L 21/565; H01L 23/3107; H01L 23/49503; H01L 23/49541; H01L 24/85; H01L 2224/48091; H01L 2224/48106; H01L 2224/48247; H01L 2924/14; H01L 2924/146
See application file for complete search history.

(56) References Cited

U.S. PATENT DOCUMENTS

| | | | |
|---|---|---|---|
| 4,314,225 A | | 2/1982 | Tominaga et al. |
| 4,686,764 A | * | 8/1987 | Adams ................ G01L 19/0645 |
| | | | 156/303.1 |
| 5,266,827 A | | 11/1993 | Kato |
| 5,438,876 A | * | 8/1995 | Lewis ................ G01L 19/0084 |
| | | | 73/721 |
| 5,522,267 A | * | 6/1996 | Lewis ................ G01L 19/0084 |
| | | | 73/706 |

(Continued)

*Primary Examiner* — Freddie Kirkland, III
(74) *Attorney, Agent, or Firm* — Charles E. Bergere (57) ABSTRACT

An integrated circuit (IC) device includes a pressure sensor die, a flexible gel covering a least a pressure-sensing region of the die, and a flexible diaphragm covering the gel. The IC device has encapsulant and a lid that define a cavity above the diaphragm. The lid has an aperture that enables proximate ambient air pressure outside the device to be sensed by the pressure-sensing region through the flexible diaphragm and the flexible gel. The diaphragm protects the gel material from potentially harmful ambient materials. The diaphragm may be a part of the lid.

16 Claims, 4 Drawing Sheets

(56) References Cited

U.S. PATENT DOCUMENTS

| | | | |
|---|---|---|---|
| 5,581,226 A * | 12/1996 | Shah | G01L 19/0084 338/36 |
| 5,604,363 A | 2/1997 | Ichihashi et al. | |
| 6,214,634 B1 * | 4/2001 | Osajda | G01L 19/0645 338/4 |
| 6,401,545 B1 | 6/2002 | Monk et al. | |
| 6,931,934 B2 | 8/2005 | Gall et al. | |
| 7,749,797 B2 * | 7/2010 | Bauer | H01L 24/83 257/433 |
| 7,798,006 B2 | 9/2010 | Vickery et al. | |
| 8,044,929 B2 * | 10/2011 | Baldo | G01L 9/0045 345/156 |
| 8,230,743 B2 * | 7/2012 | Wade | G01L 9/0052 73/706 |
| 8,359,927 B2 | 1/2013 | Hooper et al. | |
| 8,716,846 B2 | 5/2014 | Yao et al. | |
| 8,937,380 B1 | 1/2015 | Vaupel | |
| 9,040,352 B2 | 5/2015 | Kuo et al. | |
| 9,190,352 B2 * | 11/2015 | Tiu | H01L 23/49575 |
| 9,476,788 B2 * | 10/2016 | Kalandar | G01L 19/0618 |
| 9,663,350 B2 * | 5/2017 | Hooper | B81B 7/0061 |
| 9,952,110 B2 * | 4/2018 | Beer | G01L 9/0041 |
| 2005/0236644 A1 | 10/2005 | Getten et al. | |
| 2007/0279845 A1 * | 12/2007 | Kuhnt | G01L 19/0645 361/679.01 |
| 2015/0137279 A1 * | 5/2015 | Tiu | H01L 23/49575 257/415 |
| 2017/0176278 A1 * | 6/2017 | Chen | B81B 7/0045 |

* cited by examiner

PRESSURE-SENSING INTEGRATED CIRCUIT DEVICE WITH DIAPHRAGM

BACKGROUND

The present invention relates to pressure sensor integrated circuit devices and, more particularly, to a lid for a pressure sensing device.

Integrated circuits (ICs) that can measure air pressure are useful in many applications. One such application is a tire-pressure monitoring system (TPMS). A conventional TPMS uses pressure-sensing ICs to measure the pressure of the tires of a wheeled vehicle, where each IC further includes a transmitter for transmitting sensed pressure information to a TPMS processor. The TPMS processor continuously monitors the air pressure in each of the tires and generates a signal if the pressure in any of the tires falls outside of a specified range.

Figure 1:
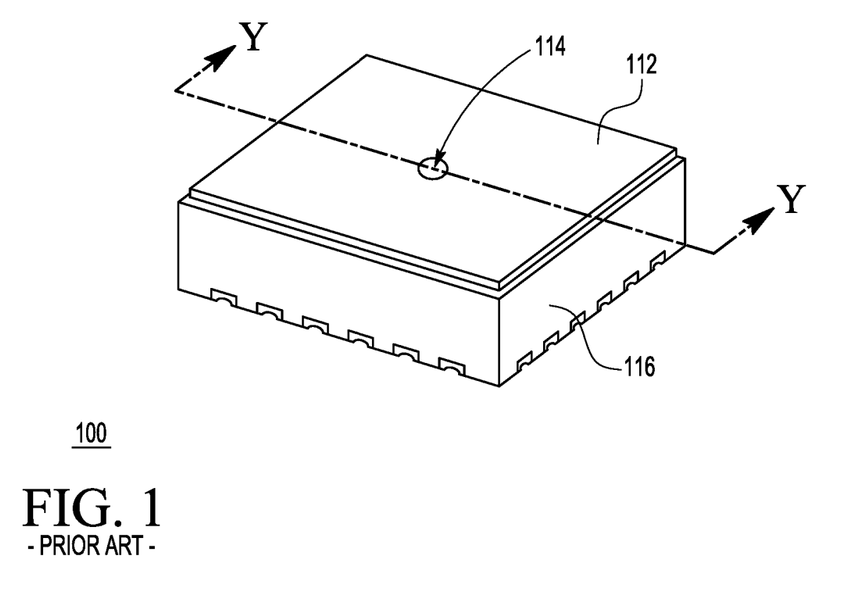
FIG. 1 is a top-side perspective view of a conventional packaged IC pressure-sensing device.
Figure 2:
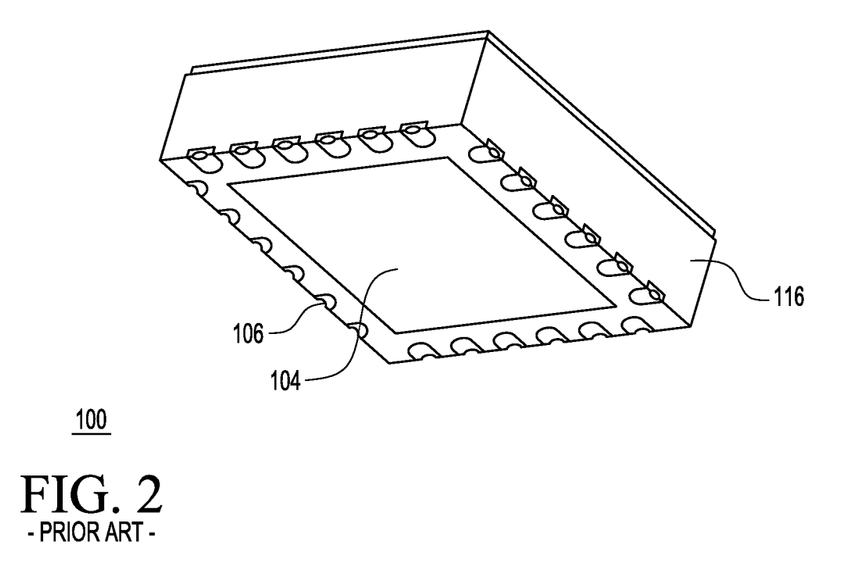
FIG. 2 is a bottom-side perspective view of the device of FIG. 1.
Figure 3:
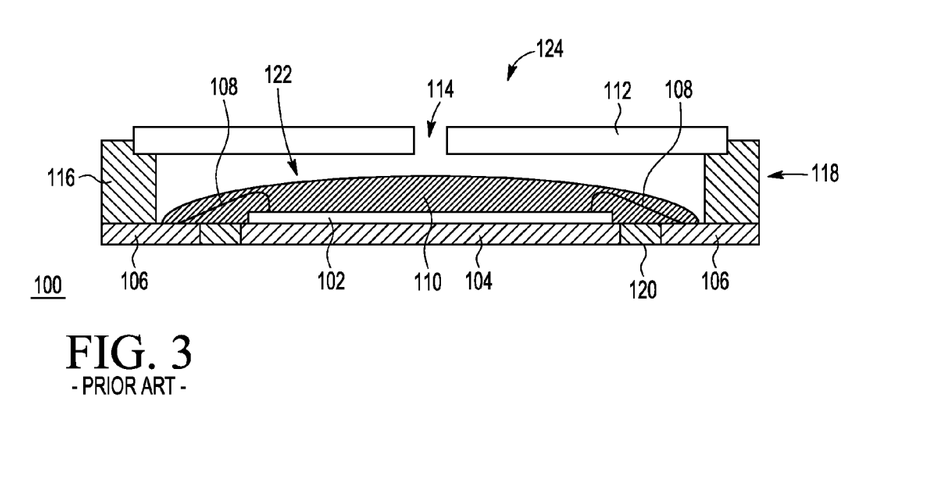
FIG. 3 is a cross-sectional side view of the device of FIG. 1.

FIG. 1 is a top-side perspective view of a conventional pressure-sensing device 100. FIG. 2 is a bottom-side perspective view of the device 100, and FIG. 3 is a cross-sectional side view of the device 100 along cut line Y-Y in FIG. 1. The device 100 is a quad flat no-lead (QFN) packaged device.

The device 100 comprises a die 102 attached with, e.g., a die attach material (not shown), to a metallic thermal pad 104 on the bottom of the device 100. The metallic thermal pad 104 is sometimes referred to as a die paddle. The device 100 further comprises a plurality of leads or contacts 106 and corresponding bond wires 108. The bond wires 108 connect the leads 106 to corresponding die pads (not shown) on the top surface of the die 102. In the device 100, the leads 108 do not extend out from the exterior surface of the device 100 (hence the "no-lead" part of the "quad flat no-lead" package designation for the device 100).

The top surface of the die 102 has a pressure-sensing region (not shown). A layer of flexible gel 110 covers the top of the die 102 and the bond wires 108. The gel 110 protects the die 102 and the bonding wires 304 from damage caused by the environment. The top side of the device 100 has a lid 112 with an aperture 114. The lid 112 may be metallic, or made from any other suitable material. The lid 112 typically is marked with information identifying the device 100 and its manufacturer.

The device 100 further comprises an encapsulant 116 that forms parts of side walls 118 and floor 120 of the device 100. The floor 120 is the bottom section of the device 100 that includes the paddle 104, the leads 106, and the interstitial portions of the encapsulant 116.

Between the lid 112, the side walls 118, the gel 110, and any exposed portions of the floor 120 is a cavity 122. Due to the aperture 114, the air pressure inside the cavity 122 is the same as the ambient air pressure of the proximate exterior 124 of the device 100. The aperture 114 is sized to be large enough for rapid equalization of pressure between the exterior 124 and the cavity 122 and small enough to prevent certain debris and other objects from entering the cavity 122 by way of the aperture 114 and damaging the gel 110, the die 102, and/or the bond wires 108. The pressure sensor of the die 102 is able to sense the air pressure in the cavity 122 through the flexible gel 110. The device 100 may be surface mounted, via the leads 106, to a printed circuit board (PCB) (not shown) for connection to other components of the TPMS, such as, for example, a micro controller and/or a transmitter.

Depending on a variety of factors, such as, for example, the composition of the gel 110, the gases present in the cavity 122 and the exterior 124, and the pressures of those gases—the gel 110 may suffer one or more adverse effects—such as, for example, the formation of bubbles inside the gel 110 or the stiffening of the gel 110. Accordingly, it would be advantageous to be able to better protect the gel 110.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

In one embodiment, a flexible diaphragm is used as a barrier between the flexible gel of a pressure-sensing IC device and the ambient environment. The diaphragm helps eliminate or reduce some or all of the previously described adverse effects on the gel material.

In one embodiment, a pressure-sensing integrated circuit (IC) device comprises a die comprising a pressure sensor, a flexible gel covering the pressure sensor, and a flexible diaphragm covering the flexible gel. The diaphragm and the flexible gel enable the pressure sensor to sense ambient pressure outside of the IC device.

Figure 4:
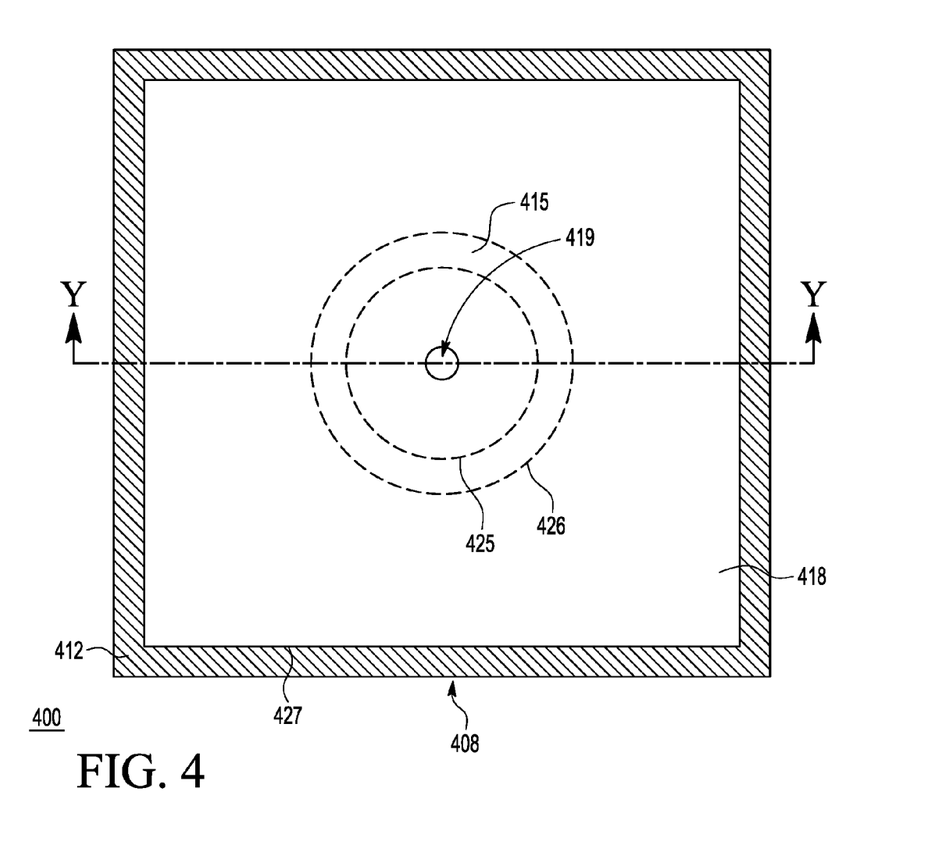
FIG. 4 is a top view of a device in accordance with an embodiment of the present invention.
Figure 5:
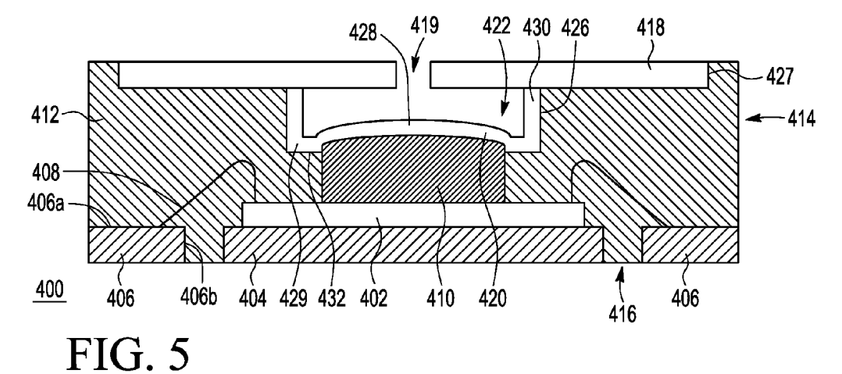
FIG. 5 is a cross-sectional side view of the device of FIG. 4.
Figure 6:
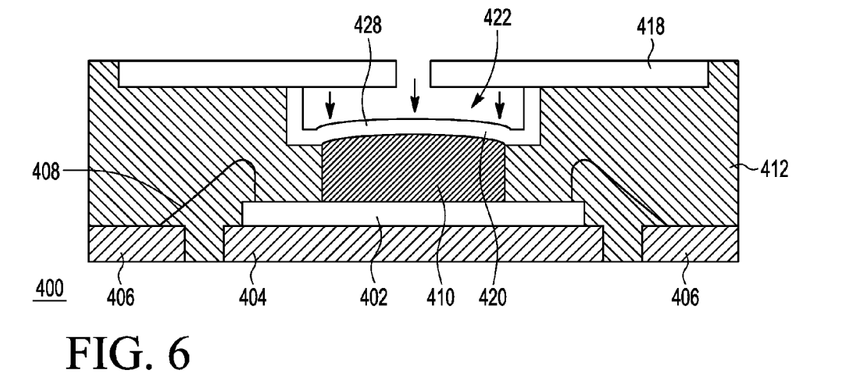
FIG. 6 is a cross-sectional side view of the device of FIG. 5 under a higher pressure.
Figure 7:
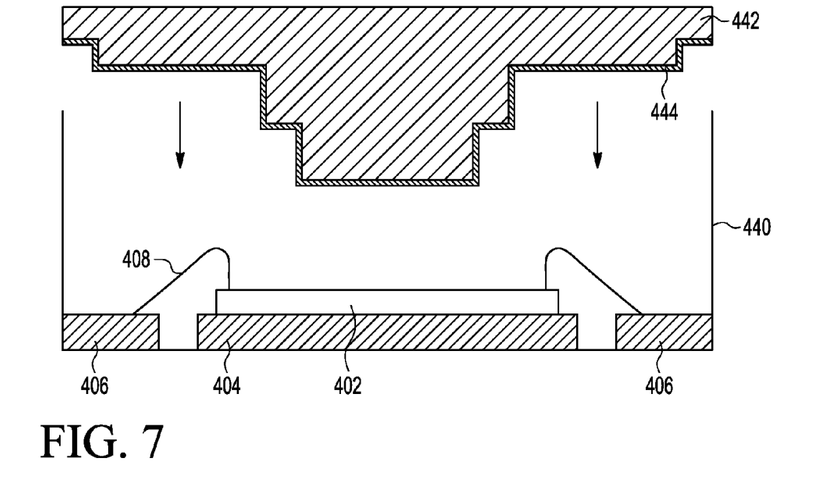
FIG. 7 is a cross-sectional side view of a step in the assembly of the device of FIG. 4 in accordance with one embodiment of the invention.
Figure 8:
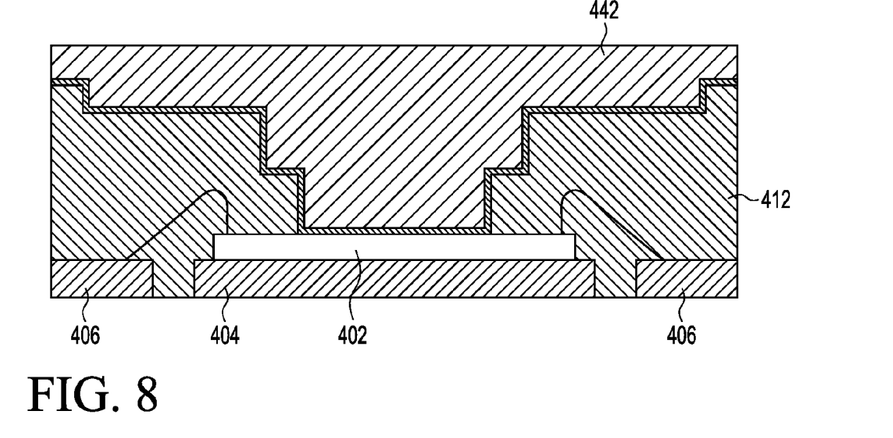
FIG. 8 is a cross-sectional side view of a subsequent step in the assembly of the device of FIG. 4.
Figure 9:
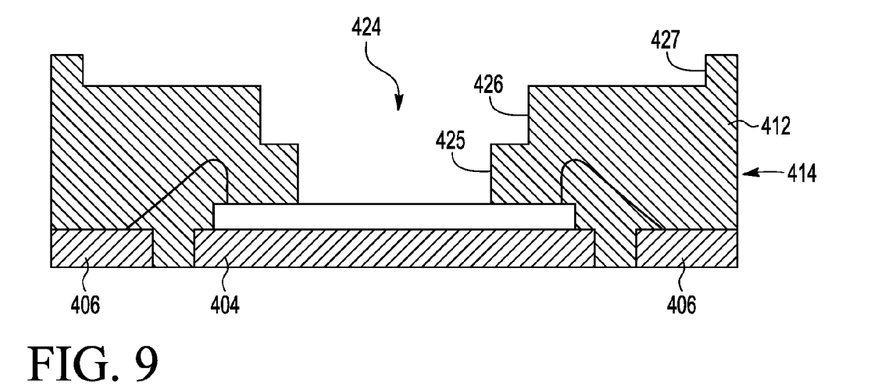
FIG. 9 is a cross-sectional side view of a further subsequent step in the assembly of the device of FIG. 4.

FIGS. 4-6 show an embodiment of the present invention, where FIG. 4 is a top plan view of a device 400 in accordance with an embodiment of the present invention is shown, FIG. 5 is a side cross-sectional view of the device 400 of FIG. 4 along cut line Y-Y, and FIG. 6 is a cross-sectional side view of the device 400 of FIG. 5 under a higher pressure. FIGS. 7-9 show the device 400 at various steps in the assembly process, where FIG. 7 shows the device 400 before a molding process, FIG. 8 is a cross-sectional side view of the device 400 during the molding process, and FIG. 9 is a cross-sectional side view of the device 400 after the molding process and after removing a molding pin. In the embodiment shown, the device 400 is a QFN (Quad Flat No Lead) type packaged device comprising elements similar to those of the above-described device 100 of FIG. 1. However, it will be understood by those of skill in the art that the device 400 could comprise a leaded device, a BGA (Ball Grid Array) device, or the like.

Referring now to FIGS. 4-6, the device 400 comprises a pressure sensing die 402 attached with, e.g., a die attach material (not shown), to a paddle 404 of a lead frame. The device 400 further comprises a plurality of leads 406 and corresponding bond wires 408 that connect the leads 406 to corresponding pads on a top or active surface of the die 402.

As will be understood by those of skill in the art, the top surface of the die 402 also has a pressure-sensing region. The pressure sensing die 402 may comprise, for example, a piezo-resistive transducer, a capacitive transducer, and/or a micro-electro-mechanical system (MEMS). A flexible gel 410 covers a first portion of the top surface of the die 402 including the pressure-sensing region. The remainder of the top surface of the die 402, including the die pads, is covered with a molding compound or encapsulant 412. The encapsulant 412 also covers the bond wires 408 and interior surfaces of the leads 406, such as top surfaces 406a and inside surfaces 406b. The encapsulant 412 forms parts of the side walls 414 and the floor 416 of the device 400. The bottom surface 416 is the bottom section of the device 400 that includes the die paddle 404, the leads 406, and interstitial portions of the encapsulant 412.

The top side of the device 400 has a lid 418 with an aperture 419. It should be noted that the top of the lid 418 may be flush with, below, or extend above the top of the encapsulant 412.

A flexible diaphragm 420, located underneath the lid 418, covers, and is in direct contact with, the top of the gel 410. The space between the diaphragm 420 and the lid 418 forms a cavity 422. The diaphragm 420 is flexible and is made of a material substantially impermeable to gasses that may damage the gel 410. The diaphragm 420, which may be integral with or separate from the lid 418, may be made of, for example, rubber, silicone, plastic, metal, or thermal tape. The diaphragm 420 is able to transmit to the gel 505 the pressure in the cavity 422, as described below.

As shown in FIG. 9, in a preferred embodiment, the encapsulant 412 is shaped substantially as a three-tiered open box having the exterior side walls 414, an interior recess 424 on the top side of the encapsulant 412, and each of the tiers has a corresponding inner wall. The bottom tier is defined by an inner wall 425 that circumscribes most or all of the gel 410. The middle tier is defined by an inner wall 426 that circumscribes most or all of the diaphragm 420 and the cavity 422. The top tier is defined by an inner wall 427 that circumscribes at least a portion of the lid 418.

The diaphragm 420 is a unitary object having several portions including a convex central section 428, an annular support section 429, and an annular wall section 430. The central section 428 sits on top of, and in contact with, the convex top of the gel 410. The support section 429 sits on top of, and in contact with, an annular flange 432, which corresponds to the exposed top surface of the bottom tier of the encapsulant 412. The wall section 430 contacts the inner wall 426 of the middle tier and extends vertically from the support section 429 to the lid 418. The support and wall sections 429 and 430 help keep the central section 428 in place.

Due to the aperture 419, the air pressure inside the cavity 422 is the same as the ambient air pressure outside of the device 400. The aperture 419 is sized to be large enough for rapid equalization of pressure between the exterior and the cavity 422 and small enough to prevent certain debris and other objects from entering the cavity 422 and damaging the inner components of the device 400. The pressure-sensing die 402 is able to sense the air pressure in the cavity 422 as transmitted by the diaphragm 420 and the gel 410. As seen in FIG. 6, at a higher pressure—relative to FIG. 5—the central section 428 of the diaphragm 420 is deformed (i.e., flattened) and compresses the gel 410, which, in turn, presses with greater force on the pressure-sensing region of the die 402.

The device 400 may be assembled using a conventional film-assisted molding (FAM) process. Namely, as represented in FIG. 7, following attachment of the die 402 to the paddle 404 and the wire-bonding of the die 402 to the leads 406 with the bond wires 408, the device is placed in a molding enclosure 440. A mold pin or shaping form 442, to which a film 444 is attached, is lowered into the molding enclosure 440 and onto the die 402. The shaping form 442 defines the shape of the above-described recess 424.

Subsequently, as shown in FIG. 8, uncured molding compound is injected into the molding enclosure 440 such that the molding compound fills the space between the molding enclosure 440 and the shaping form 442. The shaping form 442 and the film 444 prevent the molding compound 412 from reaching the pressure-sensing region on the top of the die 402. The encapsulant 412 is then cured and then the shaping form 442 and the film 444 are removed, leaving behind the recess 424 (FIG. 9). Subsequently, the gel 410 is injected (or otherwise placed) into the recess 424, then the diaphragm 420 is placed into the recess 424, and then the lid 418 is added to form the device 400 of FIG. 4. Note that if the lid 418 and diaphragm 420 are one piece, then it only takes one step to place the lid (and diaphragm). The film 444 may protect the pressure-sensing region of the die 402 during encapsulation and may promote easier withdrawal of the shaping form 442 after the curing of the encapsulant 412.

Figure 10:
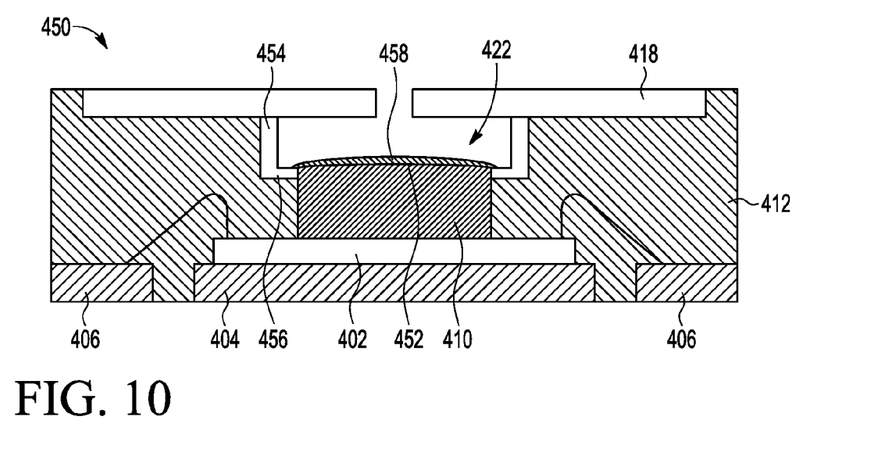
FIG. 10 is a cross-sectional side view of a device in accordance with an alternative embodiment of the invention.

FIG. 10 is a cross-sectional side view of a device 450 in accordance with an alternative embodiment of the invention. The device 450 is substantially similar to the device 400, except that the device 450 uses a diaphragm 452 that is different from the diaphragm 420 of the device 400. Specifically, rather than being a single unitary component made of a single material, the diaphragm 452 comprises two different components formed from different materials. In particular, the diaphragm 452 comprises (i) a wall portion 454 and a support portion 456 made of a first material and (ii) a central portion 458 made of a second material different from the first material.

Note that the first and second materials may be chosen from among, for example, metal, plastic, rubber, silicone, and thermal tape. The wall portion 454 and the support portion 456 are similar to the wall section 430 and the support portion 429 of the diaphragm 420. Note that the central portion 458 is attached to the support portion 456 to keep the central portion in place on top of the gel 410. The diaphragm 452 may be manufactured, e.g., by molding, and assembled separately into a unitary object and then inserted into place in the recess 424 as part of the assembly of the device 400.

Embodiments of the invention have been described where the wall portion of the diaphragm is in contact with the corresponding encapsulant wall. The invention is not, however, so limited. In some alternative embodiments, the wall portion of the diaphragm is not in contact with the corresponding encapsulant wall.

Embodiments of the invention have been described where the diaphragm comprises central, support, and wall portions. The invention is not, however, so limited. In alternative embodiments, the diaphragm comprises only the central portion. In other alternative embodiments, the diaphragm comprises the central portion and the support portion. In some implementations of the embodiments where the diaphragm comprises only the central portion, the side walls of the middle tier of the encapsulant may abut the central portion to provide support to the central portion and keep the central portion in place. In some implementations of the above-described alternative embodiments, the side walls of the middle tier may have features to help keep the diaphragm in place.

Embodiments of the invention have been described where the central portion of the diaphragm is convex to mate with the convex top of the gel. The invention is not, however, so limited. In alternative embodiments, the top of the gel and the adjoining central portion of the diaphragm may be flat or concave.

Embodiments of the invention have been described where the aperture in the lid of the device is small enough to prevent most debris from entering the under-lid cavity. The invention is not, however, so limited. Since the diaphragm provides an additional layer of protection, in some alternative embodiments, the aperture may be as large as the area circumscribed by the inner wall of the bottom tier of the encapsulant. In some other alternative embodiments, the aperture may be as large as the area circumscribed the inner wall of the middle tier of the encapsulant.

Embodiments of the invention have been described where the IC device is a QFN package. The invention is not, however, so limited. The IC device may be in the form of any suitable package, and alternative embodiments of the invention are packaged in packages other than QFN packages.

Embodiments of the invention have been described where the die is electrically connected to contacts—e.g., leads—on the exterior of the device using bonding wires. The invention is not, however, so limited. Any suitable means may be used to electrically connect the die to the device contacts. For example, in some alternative embodiments, the device is a flip chip (i) whose floor comprises a substrate having vias, a routing layer, and/or the device contacts and (ii) which is electrically connected to the die with conductive balls. The die may be further attached to the substrate using the encapsulant or a different underfill material.

Embodiments of the invention have been described where (i) the gel, the diaphragm, and the under-lid cavity have circular shapes in a plan view and (ii) the lid has a rectangular shape in a plan view. The invention is not, however, so limited. The gel, diaphragm, under-lid cavity, and lid may have any suitable shape that allows the device to function as described.

Embodiments of the invention have been described where the device measures the pressure of air within its cavity and the adjoining exterior. The invention is not, however, limited to devices for measuring air pressure. The device may be used to measure the pressure of any gas. Note that, in some alternative embodiments, the central portion of the diaphragm is substantially impermeable to components other than gases typically found in air. In some alternative embodiments, the device is used to measure the pressure of a liquid in the cavity and proximate exterior of the device. Note that, in some of these alternative embodiments, the central portion of the diaphragm is substantially impermeable to the components of the liquids whose pressure the device is measuring.

Embodiments of the invention have been described where the gel covers only a portion of the top of the die. The invention is not, however, so limited. In alternative embodiments, the gel may cover the entirety of the top of the die. In addition, the gel may also cover the bonding wires of the device.

An exemplary assembly process for an embodiment of the invention has been described. The invention is not, however, so limited. As would be appreciated by a person of ordinary skill in the art, alternative assembly methods may be used to assemble a device in accordance with embodiments of the invention. For example, in one alternative embodiment, multiple devices are assembled together. Specifically, multiple dies are attached to and electrically connected to corresponding lead frames of a lead frame array to form a plurality of devices interconnected via the shared lead frame array. Then, in the encapsulation step, using a molding enclosure sized to fit the lead frame array, a corresponding plurality of top forms and films are used to shape a plurality of open encapsulant boxes corresponding to the plurality of devices. The devices may be then singulated prior to completing their assembly. Alternatively, the devices may have the gel added, the diaphragm inserted, and/or the lid added prior to singulation.

Various embodiments with various features have been described above. It should be noted that, unless otherwise specified or impossible, additional alternative embodiments may combine features from multiple above-described embodiments.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

A lead frame is a collection of metal leads and possibly other elements (e.g., die paddles, power bars) that is used in semiconductor packaging for assembling one or more IC dies into a single packaged semiconductor device. Prior to assembly into a packaged device, a lead frame may have support structures (e.g., a rectangular metal frame) that keep those elements in place. During the assembly process, the support structures may be removed. As used herein, the term "lead frame" may be used to refer to the collection of elements before assembly or after assembly, regardless of the presence or absence of those support structures.

Although the steps in any following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A pressure-sensing integrated circuit (IC) device, comprising:
   a pressure-sensing die;
   a flexible gel covering at least a pressure-sensing region of the pressure-sensing die;
   a flexible diaphragm covering the flexible gel, wherein the flexible diaphragm and the flexible gel enable the pressure sensor to sense ambient pressure outside of the IC device; and
   a lid having an aperture, wherein the lid is located between the flexible gel and an exterior of the device, and the aperture permits ambient air to move the diaphragm and consequently the flexible gel so that the pressure-sensing die can measure the ambient air pressure.

2. The device of claim 1, further comprising:
   a multi-tiered encapsulant upon which the lid is attached, wherein a recess is defined beneath the lid, wherein:
      the die is partially covered by the encapsulant;
      the gel is located within a first tier of the encapsulant;
      the diaphragm is located within a second tier of the encapsulant above the first tier; and
      the lid is located within a third tier of the encapsulant above the second tier.

3. The device of claim 2, wherein the diaphragm comprises:
   a convex central section covering the gel;
   an annular wall section contacting the encapsulant; and
   an annular support section connecting the central section to the wall section.

4. The device of claim 3, wherein:
   the central section is made of a first material; and
   the wall and support sections are made of a second material different from the first material.

5. The device of claim 3, wherein:
   a top surface of the first tier of the encapsulant forms an annular flange around a portion of the gel; and
   the support section of the diaphragm covers the flange.

6. The device of claim 2, wherein:
   the device further comprises a lead frame having a paddle and a plurality of leads;
   the die is attached to the paddle and electrically connected to the leads; and
   the encapsulant covers the leads and at least a portion of the die.

7. The device of claim 6, wherein:
   the die has a plurality of die pads electrically connected to corresponding leads via corresponding bond wires;
   the die pads and the bond wires are covered with the encapsulant; and
   the pressure-sensing region is not covered by the encapsulant.

8. The device of claim 1, wherein the diaphragm is integral with the lid.

9. An integrated circuit device, comprising:
   a lead frame including a die paddle and a plurality of leads surrounding the die paddle;
   a pressure-sensing die attached to the die paddle and electrically connected to the leads;
   an encapsulant that covers the leads and the electrical connections between the leads and the pressure-sensing die, wherein a bottom surface of the lead frame forms a bottom surface of the integrated circuit device and the encapsulant forms side walls of the device, wherein a cavity is formed between the side walls and over the pressure-sensing die;
   a gel material covering a pressure-sensing region on a top surface of the pressure-sensing die;
   a lid that extends between the side walls and over the cavity, wherein the lid has a central opening that allows ambient air to enter the cavity so that the pressure-sensing die can measure the ambient air pressure; and
   a diaphragm located beneath the central opening and that covers the gel material.

10. The integrated circuit device of claim 9, wherein the diaphragm is integral with the lid.

11. The integrated circuit device of claim 10, wherein the lid has a top portion formed of metal and a diaphragm portion formed of a flexible material.

12. A method for assembling an integrated circuit (IC) device, the method comprising:
   attaching a die to a paddle of a lead frame, wherein the die comprises a pressure sensor;
   electrically connecting the die to leads of the lead frame;
   encapsulating a portion of the die and the lead frame with an encapsulant, wherein a recess is formed over the pressure sensor such that at least a pressure-sensing region of the die is not covered by the encapsulant;
   placing a gel into the recess and in contact with the pressure-sensing region of the die;
   inserting a diaphragm into the recess and in contact with the gel; and
   placing a lid having an aperture over the recess and the diaphragm.

13. The method of claim 12, wherein in the encapsulation step comprises:
   placing a film-covered shaping form over the pressure sensor to prevent the encapsulant from covering the pressure-sensing region and to form the shape of the recess;
   injecting an uncured encapsulant into a molding enclosure containing the die and the lead frame;
   curing the encapsulant; and
   removing the film-covered shaping form.

14. The method of claim 12, wherein the encapsulation step is performed using film-assisted molding.

15. The device of claim 1, wherein the diaphragm is impermeable to at least one gas in the ambient air.

16. The device of claim 1, wherein the diaphragm is a unitary article of manufacture made of one material.

\* \* \* \* \*